US012635536B2

(12) United States Patent
Loh et al.

(10) Patent No.: US 12,635,536 B2
(45) Date of Patent: May 19, 2026

(54) APPARATUSES AND METHODS FOR BRIDGE-BASED PACKAGING WITH DIRECT POWER DELIVERY

(71) Applicant: Advanced Micro Devices, Inc., Santa Clara, CA (US)

(72) Inventors: Gabriel H Loh, Bellevue, WA (US); Eric J Chapman, Austin, TX (US); Rahul Agarwal, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 713 days.

(21) Appl. No.: 17/948,325

(22) Filed: Sep. 20, 2022

(65) Prior Publication Data

US 2025/0201722 A1 Jun. 19, 2025

(51) Int. Cl.
H01L 25/00 (2006.01)
H01L 23/538 (2006.01)
H01L 25/065 (2023.01)

(52) U.S. Cl.
CPC ...... H01L 23/5385 (2013.01); H01L 25/0652 (2013.01); H01L 25/0655 (2013.01); H01L 25/0657 (2013.01); H01L 25/50 (2013.01); H01L 23/5384 (2013.01)

(58) Field of Classification Search
CPC ............. H01L 23/5385; H01L 25/0652; H01L 25/0622
See application file for complete search history.

(56) References Cited

U.S. PATENT DOCUMENTS

| | | | | |
|---|---|---|---|---|
| 11,671,010 B2 * | 6/2023 | Roth | ...................... | H01L 23/50 |
| | | | | 257/499 |
| 11,735,572 B2 * | 8/2023 | Jeng | ................... | H01L 25/0655 |
| | | | | 257/668 |
| 2016/0379845 A1 * | 12/2016 | Oh | ........................ | H01L 21/486 |
| | | | | 438/126 |
| 2021/0193637 A1 * | 6/2021 | Jeng | ................... | H01L 25/0657 |
| 2021/0249952 A1 * | 8/2021 | Roth | .................... | H02M 3/003 |
| 2022/0278032 A1 * | 9/2022 | Pietambaram | .......... | H01L 24/16 |
| 2023/0134049 A1 * | 5/2023 | Mallik | .................. | H01L 21/486 |
| | | | | 257/668 |
| 2023/0261572 A1 * | 8/2023 | Roth | ................. | H01L 23/49589 |
| | | | | 257/499 |
| 2024/0222286 A1 * | 7/2024 | Rahman | .................. | H01L 25/18 |

* cited by examiner

*Primary Examiner* — Thao P Le
(74) *Attorney, Agent, or Firm* — Greenberg Traurig, LLP

(57) ABSTRACT

The disclosed computer-implemented apparatus for bridge-based packaging with direct power delivery can include an first layer stacked on a second layer. The second layer can include an interposer die and a connection die. The first layer can include a chiplet die positioned above the interposer die and a first-layer bridge die spanning across the interposer die and the connection die. The interposer die can include a set of physical interfaces and a set of routing features configured to route signals from the set of physical interfaces to the first-layer bridge die. Various other apparatuses, systems, and methods of manufacture are also disclosed.

20 Claims, 12 Drawing Sheets

APPARATUSES AND METHODS FOR BRIDGE-BASED PACKAGING WITH DIRECT POWER DELIVERY

BACKGROUND

A 3D stacked die package can use an elevated fanout bridge to connect two chips.

BRIEF DESCRIPTION OF THE DRAWINGS

The accompanying drawings illustrate a number of example implementations and variations and are a part of the specification. Together with the following description, these drawings demonstrate and explain various principles of the present disclosure.

Figure 1:
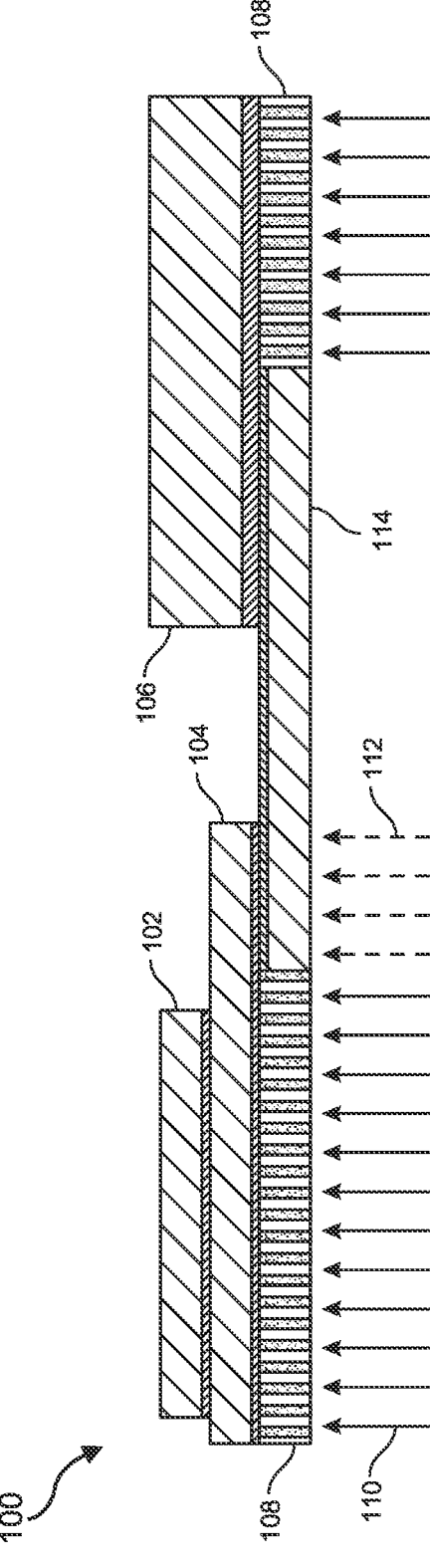
FIG. 1 is an illustration of an example chip packaging.

Throughout the drawings, identical reference characters and descriptions indicate similar, but not necessarily identical, elements. While the example implementations and variations described herein are susceptible to various modifications and alternative forms, specific implementations and variations have been shown by way of example in the drawings and will be described in detail herein. However, the example implementations and variations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to apparatuses and methods for bridge-based packaging with direct power delivery. An apparatus can include a 3D chip stack connected to a separate chip via an elevated fanout bridge. The apparatus can be configured to deliver power (e.g., via underlying copper pillars) to an interposer die without obstruction. Instead of blocking any part of the power delivery to the interposer die, through-silicon vias can be placed in the edge of the interposer die, and additional through-silicon vias can be placed in a dummy die on top of the elevated fanout bridge. A backside bridge (e.g., a laterally spanning passive chip-on-wafer) can transmit signals from the physical interfaces of the interposer die to the elevated fanout bridge through the two sets of through-silicon vias. Another approach can include placing through-silicon vias directly in the elevated fanout bridge. In some examples, one or more components, such as the dummy die, the elevated fanout bridge, and/or the backside bridge can include active circuitry, such as circuitry implementing self-testing logic.

By avoiding obstruction of power delivery to the interposer die, the apparatuses described herein can improve the reliability and performance of one or more chips of the apparatus and/or a system that includes apparatus. For example, if direct power delivery to sensitive analog circuitry enabling a set of physical interfaces in the interposer die is blocked, the analog circuitry might not receive reliable power. Unreliable power to the analog circuitry can Impact the behavior of the analog circuitry, potentially interfering with the timing of the circuitry, causing failure conditions, requiring communication retries, etc.

In one implementation, a system for bridge-based packaging with direct power delivery can include a substrate, a mold stacked on the substrate, and a chip-on-wafer module stacked on the mold. The mold can include a fanout bridge and a set of electrical connectivity elements. The chip-on-wafer module can include an first layer stacked on a second layer. The second layer can Include an interposer die and a connection die. The first layer can include a chiplet die positioned above the interposer die and a first-layer bridge die spanning across the interposer die and the connection die. The interposer die can include a set of physical interfaces and a set of routing interfaces configured to route signals from the set of physical interfaces to the first-layer bridge die.

In some implementations, a subset of the set of electrical connectivity elements can be below the set of physical interfaces.

In some implementations, the system can further include a connected module stacked on the mold and at least in part over a second side of the fanout bridge.

In some implementations, the connection die can be configured to route signals from the bridge die to a fanout bridge below the connection die. In some variations, the connection die can include a set of vias configured to route signals from the bridge die to the fanout bridge.

In some implementations, the interposer die can be an active die and the chiplet die can be an active die. In some variations, the first-layer bridge die can be a passive die. In some variations, the connection die can be a passive die. In some variations, the first-layer bridge die and/or the connection die can be an active die including circuitry configured to implement a built-in self-test.

In some implementations, the set of routing features can include a set of vias. In some variations, the set of vias can include, for each logical connection from the set of physical interfaces, a subset of vias connected in parallel.

In one implementation, an apparatus for bridge-based packaging with direct power delivery can include an first layer stacked on a second layer. The second layer can include an interposer die and a connection die. The first layer can include a chiplet die positioned above the interposer die and a first-layer bridge die spanning across the interposer die and the connection die. The interposer die can include a set of physical interfaces and a set of routing interfaces configured to route signals from the set of physical interfaces to the first-layer bridge die.

In one implementation, a method of manufacture for bridge-based packaging with direct power delivery can include coupling an interposer die and a communication die to a carrier, constructing a first set of vias in the communication die, constructing a second set of vias in a side of the interposer die proximate to the communication die, coupling a chiplet die to the interposer die, and coupling a bridge die to span the interposer die and the communication die, spanning the first set of vias and the second set of vias.

Features from any of the implementations and variations described herein may be used in combination with one another in accordance with the general principles described herein. These and other implementations, variations, features, and advantages will be more fully understood upon reading the following detailed description in conjunction with the accompanying drawings and claims.

The following will provide, with reference to FIG. 1, detailed descriptions of an example chip packaging. In addition, detailed descriptions of example apparatuses for bridge-based packaging with direct power delivery will be provided in connection with FIGS. 2-12.

FIG. 1 is an illustration of an example chip packaging 100. As illustrated in this figure, example chip packaging 100 can include a chiplet die 102 stacked on an interposer die 104. Chip packaging 100 can also include a connected module 106. Interposer die 104 and connected module 106 can be connected by an elevated fanout bridge 114 (which can, e.g., transmit signals between interposer die 104 and connected module 106, thereby facilitating communication between chiplet die 102 and connected module 106). Chip packaging 100 can also include copper pillars 108 that can deliver power (e.g., from a substrate below—not pictured) to interposer die 104 and connected module 106. Thus, for example, copper pillars 108 can deliver power to interposer die 104 across power delivery area 110. However, in some implementations, as can be appreciated from FIG. 1, because a portion of elevated fanout bridge 114 is directly below a portion of interposer die 104, there is no direct power delivery to interposer die 104 across area 112.

In some implementations, the lack of direct power delivery to interposer die 104 across area 112 can reduce the reliability of power delivery to one or more parts of interposer die 104 (e.g., within area 112). In some variations, impacts to the reliability of power delivery to area 112 of interposer die 104 can impact the behavior of interposer die 104. For example, in some variations area 112 can include sensitive analog circuitry that enables a set of physical interfaces in the interposer die involved in communications between chiplet die 102 and connected module 106. Unreliable power to the analog circuitry can potentially interfere with the timing of the circuitry, cause failure conditions, require communication retries, etc., potentially impacting the reliability and performance of a system using chip packaging 100. Many implementations and variations of apparatuses and systems for bridge-based packaging with direct power delivery described herein can improve power delivery and, thus, the associated performance and reliability of the apparatuses and systems.

Figure 2:
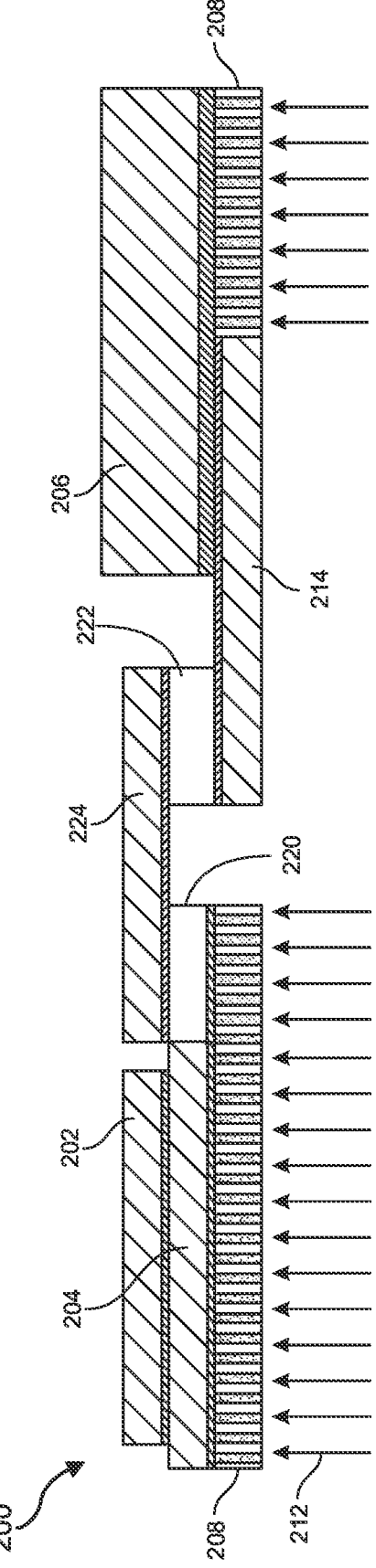
FIG. 2 is an illustration of an example apparatus for bridge-based packaging with direct power delivery.

FIG. 2 is an illustration of an example apparatus 200 for bridge-based packaging with direct power delivery. As shown in FIG. 2, apparatus 200 can include a chiplet die 202, an interposer die 204, a connected module 206, a fanout bridge 214, a set of electrical connectivity elements 208, a connection die 222, and an upper bridge 224. Interposer die 204 can include a set of routing features 220 (e.g., to one side of interposer die 204). Connection die 222 can also include a set of routing features.

As used herein, the term "chiplet" can refer to any microchip and/or integrated circuit. In some examples, a chiplet can be a module that forms a part of a larger integrated circuit. In some examples, a chiplet can form a part of a multi-chip module. In some variations, chiplet die 202 can be a system-on-a-chip. While FIG. 2 illustrates a single chiplet die 202 stacked on interposer die 204, variations of apparatus 200 can include any suitable number of chiplets on interposer die 204. In some implementations, chiplet die 202 can be configured to perform one or more processing functions. In one variation, chiplet die 202 can include a hardware accelerator. For example, chiplet die 202 can include a graphics processing unit. In various implementations, chiplet die 202 can be an active die. As used herein, the term "active die" generally refers to a die with one or more active components. Examples of active components include, without limitation, active integrated circuits. As used herein, the term "passive die" generally refers to a die without active components.

As used herein the term "interposer" can refer to any element that can act as a layer between one or more dies and a substrate. In some examples, an interposer can include connections between one or more dies, connections to and/or from input/output elements, and/or connections to one or more bridges to other modules, circuits, and/or elements. In some implementations, interposer die 204 can be an active interposer die and, e.g., include one or more active circuits to perform one or more functions.

As used herein, the term "fanout bridge" can refer to any type of bridge that can communicatively connect one or more package elements (e.g., chips, interposers, and/or other modules). In some implementations, fanout bridge 214 can be an elevated fanout bridge (e.g., a bridge set above and/or stacked on top of the package substrate).

As used herein, the term "electrical connectivity element" can refer to any type of material, structure, and/or device that is capable of electrical transfer. Examples of electrical connectivity elements include, without limitation, power transfer elements that perform power delivery, signal transfer elements that transmit electrical signals, and/or input/output transfer elements that transfer input/output information.

Connected module 206 can include any of a variety of modules. In some variations, connected module 206 can be a memory device. For example, connected module 206 can be a high-bandwidth memory module. In some implementations, connected module 206 can be a third-party device. For example, connected module 206 can be designed and/or manufactured by a different party (e.g., vendor, company, etc.) than the party that manufactures chiplet die 202 and/or the rest of apparatus 200.

Set of electrical connectivity elements 208 can include any elements and/or material suitable for transmitting power. In some implementations, set of electrical connectivity elements 208 can include one or more copper elements (e.g., copper pillars) that create contact between a substrate and devices above fanout bridge 214 (including, e.g., interposer die 204 and/or connected module 206). In some variants, set of electrical connectivity elements 208 can span fully across interposer die 204. Additionally or alternatively, set of electrical connectivity elements 208 can cover a portion of interposer die 204 that contains a set of physical interfaces (or "PHYs") for communicating with connected module 206 (e.g., via fanout bridge 214).

Connection die 222 can have any of a variety of configurations. In some implementations, connection die 222 can be a passive die. In some variations, connection die 222 can be a dummy die (i.e., including nothing but silicon and, as will be described in greater detail below, a set of routing features).

As used herein, the term "routing features" can refer to any structures, materials, and/or conduits capable of routing a signal (e.g., through a die). In some implementations, routing features 220 and/or the routing features of connection die 222 can include a set of vias (e.g., through-silicon vias). In some variations, apparatuses described herein can include a via for each logical connection (e.g., a connection by which to transmit one logical signal at a time) to be formed between two elements. However, in some variations, apparatuses described herein can include multiple vias per logical connection. For example, apparatuses described herein can include multiple vias in parallel per logical connection. In this manner, impedance applied to each signal traveling by the vias can be reduced. In addition, connections can be more robust against via failures or defects. In addition, as used herein, references to a "set" of elements can generally refer to one or more elements. Thus, for example, a set of routing features can refer to one or more routing features.

Upper bridge 224 can have any suitable design. In some implementations, upper bridge 224 can transmit signals between interposer die 204 (e.g., by way of routing features 220) and connection die 222 (e.g., by way of routing features in connection die 222). In some implementations, upper bridge 224 can be a passive die.

Elements of apparatus 200 can be stacked using any suitable stacking technology. For example, one or more elements of apparatus 200 can be stacked using hybrid bonding. As another example, one or more elements of apparatus 200 can be stacked using microbumping.

As can be appreciated in FIG. 2, apparatus 200 can achieve improved reliability and/or performance. For example, power can be delivered directly from below to various elements of interposer die 204 (e.g., PHYs for sending signals to connected module 206), avoiding extra impedance and routing (e.g., horizontal routing). Signals from interposer die 204 (e.g., originating from chiplet die 202 and proceeding from PHYs in interposer die 204) can travel upward through routing features 220 to upper bridge 224, through upper bridge 224, downward through connection die 222 (e.g., through routing features in connection die 222), to fanout bridge 214, through fanout bridge 214, and to connected module 206.

Figure 3:
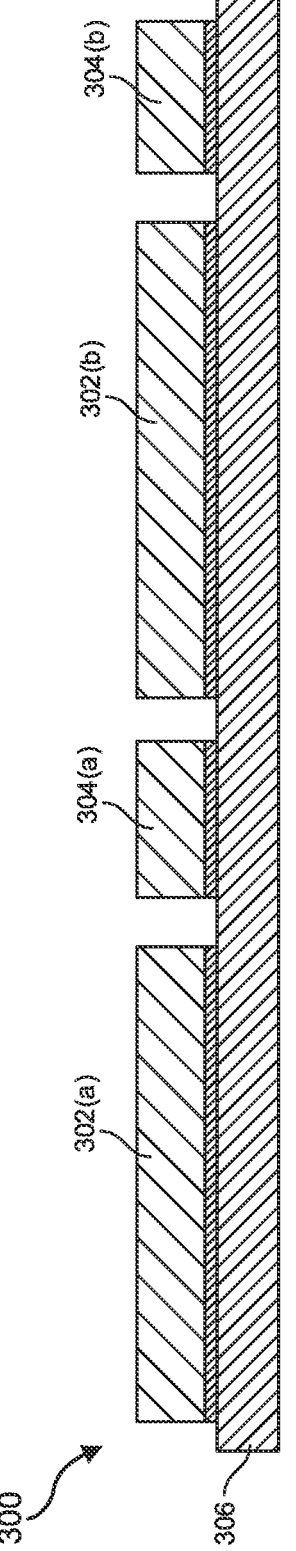
FIG. 3 is an illustration of an example intermediate apparatus in a method of manufacture for bridge-based packaging with direct power delivery.

FIG. 3 is an illustration of an example intermediate apparatus 300 in a method of manufacture for bridge-based packaging with direct power delivery. As can be seen from FIG. 3, a method of manufacture can start with a carrier 306 (e.g., a carrier wafer). The method can include coupling one or more interposer dies (e.g., interposer dies 302 (a) and (b)) to carrier 306. In addition, the method can include coupling one or more communication dies (e.g., communication dies 304 (a) and (b)) to carrier 306.

Figure 4:
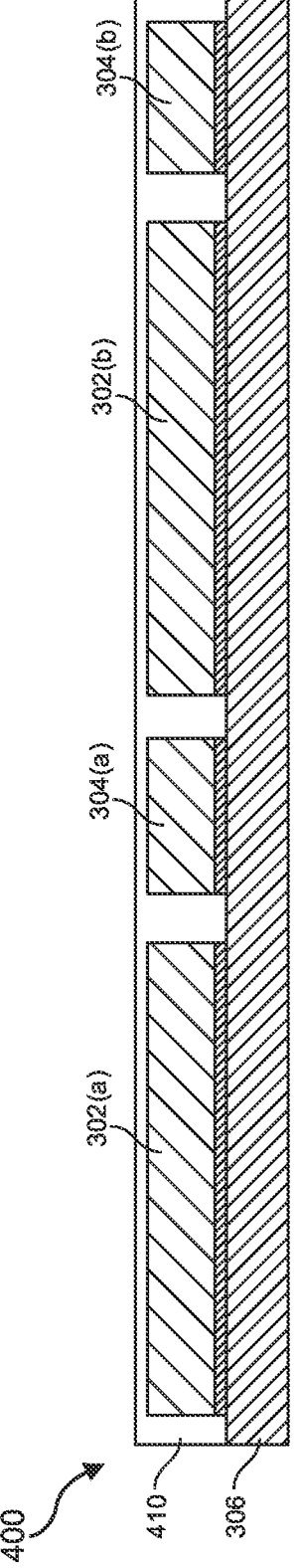
FIG. 4 is an illustration of an example intermediate apparatus in a method of manufacture for bridge-based packaging with direct power delivery.

FIG. 4 is an illustration of an example intermediate apparatus 400 in a method of manufacture for bridge-based packaging with direct power delivery. As can be seen from FIG. 4, a method of manufacture can further include overmolding apparatus 300 of FIG. 3 with a mold 410. Mold 410 can include any suitable material. In various implementations, mold 410 can include a polymer. For example, mold 410 can include an epoxy resin. Apparatus 400 can function as a reconstituted wafer.

Figure 5:
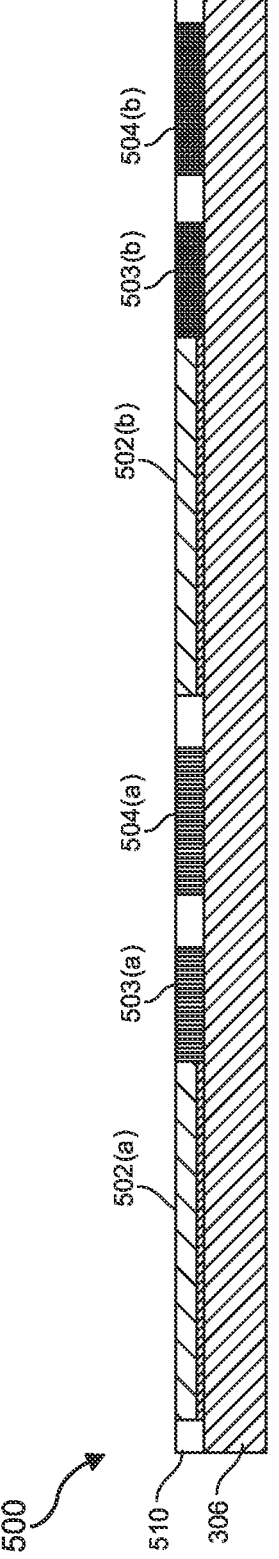
FIG. 5 is an illustration of an example intermediate apparatus in a method of manufacture for bridge-based packaging with direct power delivery.

FIG. 5 is an illustration of an example intermediate apparatus 500 in a method of manufacture for bridge-based packaging with direct power delivery. As can be seen from FIG. 5, a method of manufacture can further include thinning apparatus 400 of FIG. 4, resulting in a thinned mold 510, thinned interposer dies 502 (a) and (b), and thinned communication dies 504 (a) and (b). In addition, the method of manufacture can include the construction of sets of through-silicon vias. For example, the method can include constructing sets of through-silicon vias 503 (a) and 503 (b) in interposer dies 502 (a) and (b), respectively. In some variations, and as illustrated in FIG. 5, sets of through-silicon vias 503 (a) and 503 (b) are constructed on the side of interposer dies 502 (a) and (b) proximate to communication dies 504 (a) and (b), respectively. In addition, the method can include constructing sets of through-silicon vias in communication dies 504 (a) and (b).

Figure 6:
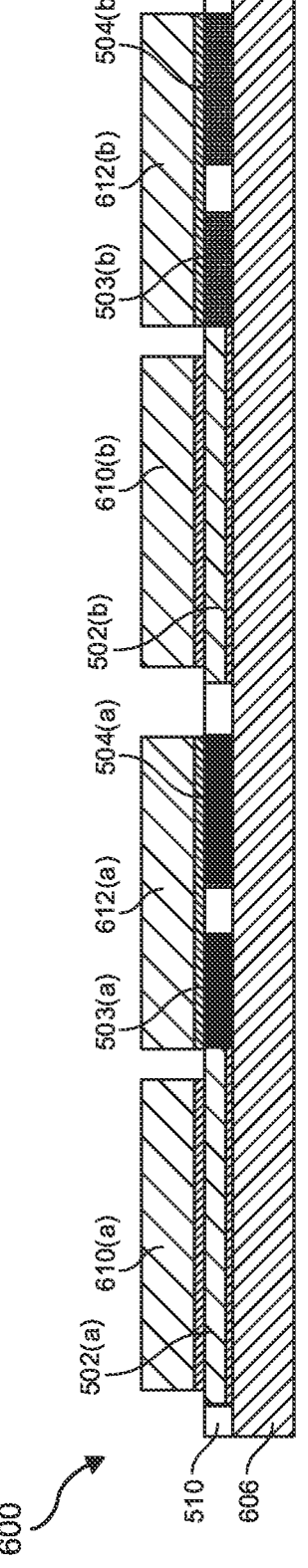
FIG. 6 is an illustration of an example intermediate apparatus in a method of manufacture for bridge-based packaging with direct power delivery.

FIG. 6 is an illustration of an example intermediate apparatus 600 in a method of manufacture for bridge-based packaging with direct power delivery. As shown in FIG. 6, a method of manufacture can include coupling chips to apparatus 500 (which functions as a wafer). For example, the method can include coupling chiplet dies 610 (a) and (b) to interposer dies 502 (a) and (b), respectively. In addition, the method can include coupling bridge die 612 (a) to span interposer die 502 (a) and communication die 504 (a), such that bridge die 612 (a) spans set of through-silicon vias 503 (a) and the through-silicon vias of communication die 504 (a). Likewise, the method can include coupling bridge die 612 (b) to span interposer die 502 (b) and communication die 504 (b), such that bridge die 612 (b) spans set of through-silicon vias 503 (b) and the through-silicon vias of communication die 504 (b).

Figure 7:
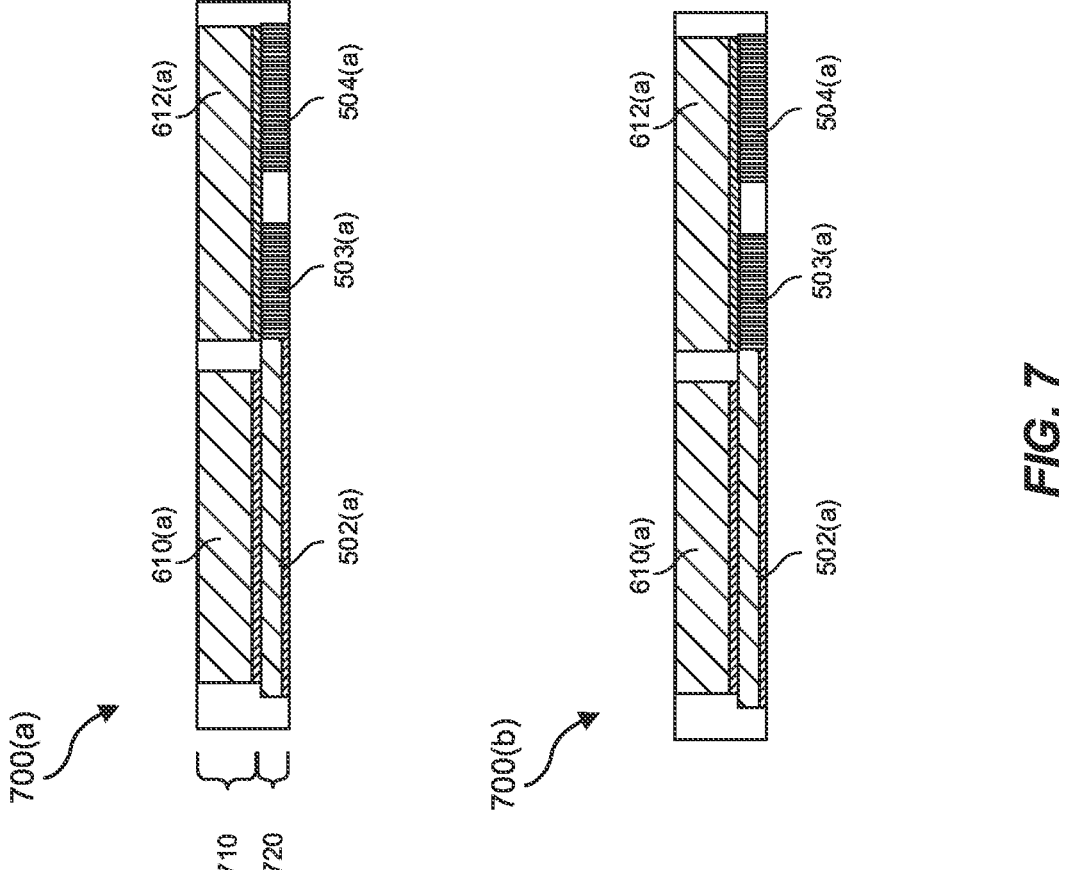
FIG. 7 is an illustration of an example intermediate apparatus in a method of manufacture for bridge-based packaging with direct power delivery.

FIG. 7 is an illustration of example intermediate apparatuses 700 (a) and (b) in a method of manufacture for bridge-based packaging with direct power delivery. As shown in FIG. 7, a method of manufacture can include molding apparatus 600 of FIG. 6 (and then, e.g., backgrinding apparatus 600) and singulating apparatus 600 into apparatuses 700 (a) and (b). Using apparatus 700 (a) as an example, apparatus 700 (a) can include an first layer 710 stacked on a second layer 720. As shown in FIG. 7, second layer 720 can include an interposer die 502 (a) and a connection die 504 (a). First layer 710 can include chiplet die 610 (a) positioned above interposer die 502 (a). First layer 710 can also include bridge die 612 (a) spanning across interposer die 602 (a) and connection die 504 (a). Interposer die 502 (a) can include a set of physical interfaces (not pictured, but, in some variations, found below bridge die 612 (a). Interposer die 502 (a) can also include set of routing features 503 (a) configured to route signals from the set of physical interfaces to bridge die 612 (a). As illustrated in FIG. 7, connection die can also include a set of routing features.

Figure 8:
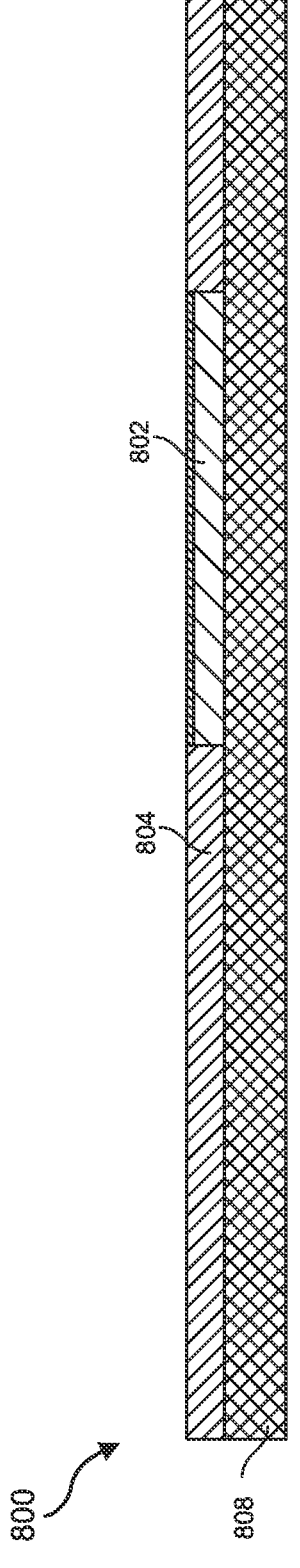
FIG. 8 is an illustration of an example intermediate apparatus in a method of manufacture for bridge-based packaging with direct power delivery.

FIG. 8 is an illustration of an example intermediate apparatus 800 in a method of manufacture for bridge-based packaging with direct power delivery. As shown in FIG. 8, apparatus 800 can include an elevated fan-out bridge 802 and a set of electrical connectivity elements 804 coupled to a package substrate 808.

Figure 9:
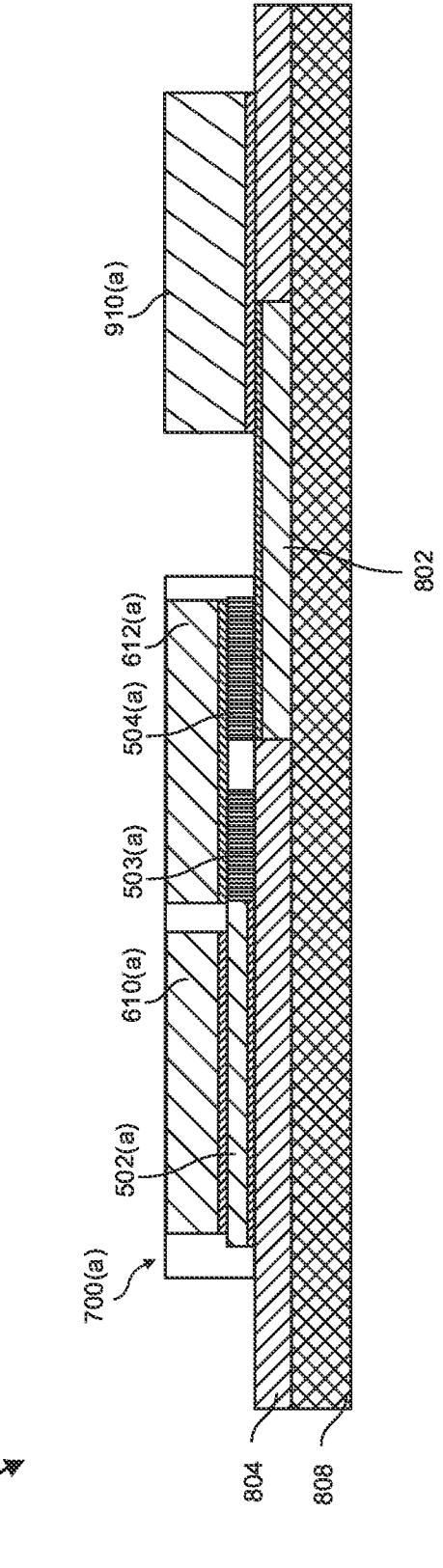
FIG. 9 is an illustration of an example intermediate apparatus in a method of manufacture for bridge-based packaging with direct power delivery.

FIG. 9 is an illustration of an example intermediate apparatus 900 in a method of manufacture for bridge-based packaging with direct power delivery. As shown in FIG. 9, a method of manufacture can include coupling apparatus 700 (*a*) from FIG. 7 to apparatus 800 of FIG. 8, such that connection die 504 (*a*) connects to elevated fanout bridge 802. In addition, the method can include coupling a module 910 (*a*) to apparatus 800 such that module 9910 (*a*) connects to elevated fanout bridge 802. In some variations, apparatus 700 (*a*) is situated on apparatus 800 such that the portion of interposer die 502 (*a*) through which the set of through-silicon vias 503 (*a*) run connects directly to underlying electrical connectivity elements in the set of electrical connectivity elements 804. In addition, in some variations, the full length of interposer die 502 (*a*) is situated on underlying electrical connectivity elements.

Figure 10:
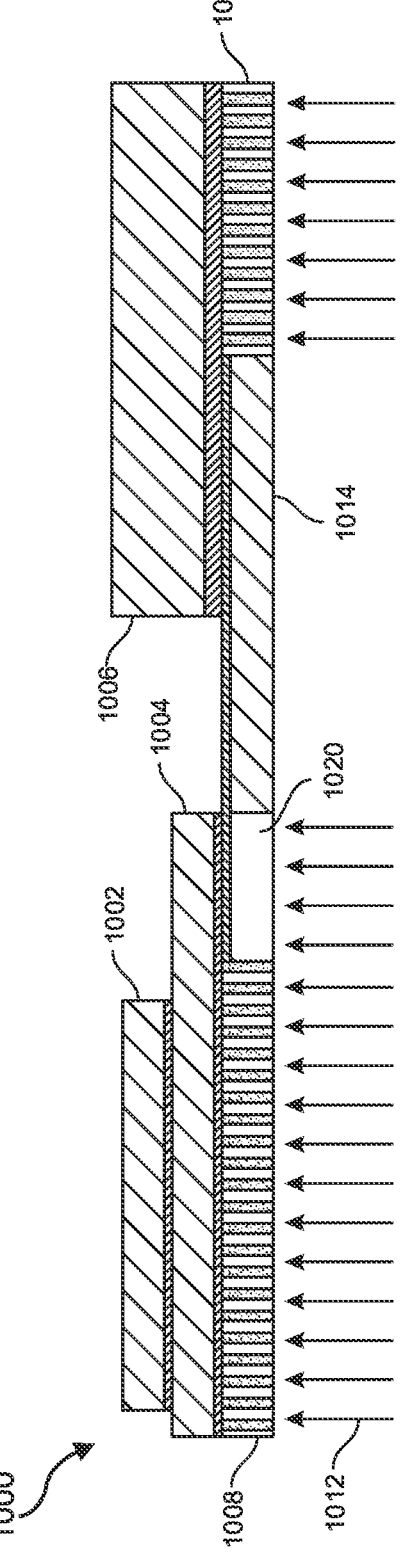
FIG. 10 is an illustration of an example apparatus for bridge-based packaging with direct power delivery.

FIG. 10 is an illustration of an example apparatus 1000 for bridge-based packaging with direct power delivery. As shown in FIG. 10, apparatus 1000 can include a chiplet die 1002, an interposer die 1004, a connected module 1006, a fanout bridge 1014, and a set of electrical connectivity elements 1008. Fanout bridge 1014 can include a set of routing features 1020. Set of routing features 1020 can route power (e.g., from a substrate below, not pictured) to a portion of interposer die 1004 (e.g., to a side of interposer die proximate to connected module 1006), thereby potentially ensuring reliable power delivery to that portion of interposer die 1004, such as, e.g., sensitive analog circuits enabling PHYs that communicate signals originating from chiplet die 1002 to communication module 1006.

Figure 11:
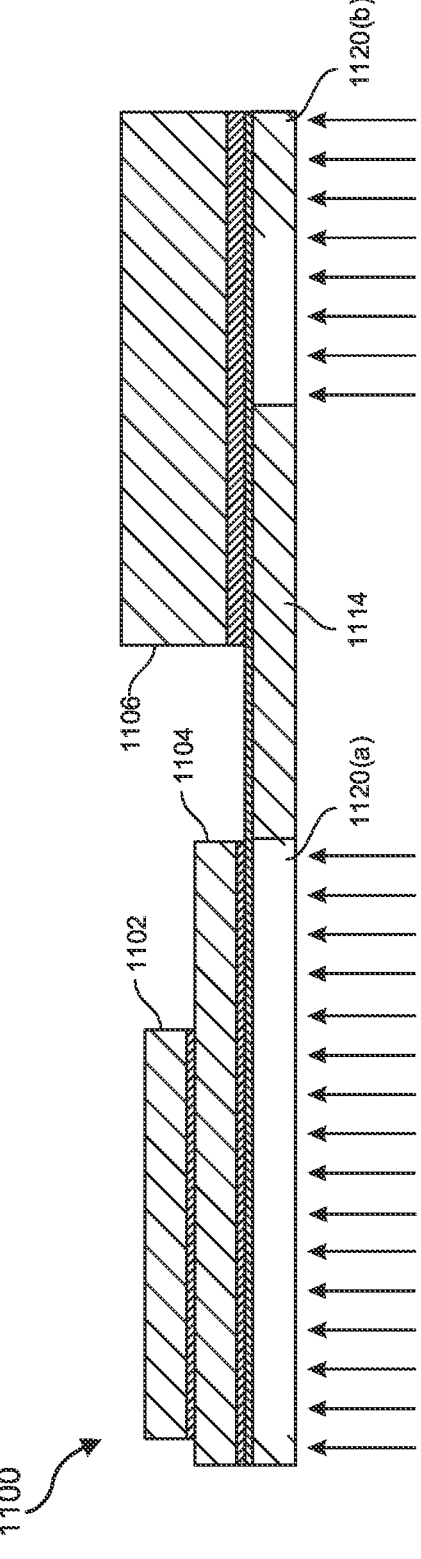
FIG. 11 is an illustration of an example apparatus for bridge-based packaging with direct power delivery.

FIG. 11 is an illustration of an example apparatus 1100. As shown in FIG. 11, apparatus 1100 can include a chiplet die 1102, an interposer die 1104, a connected module 1106, and an interposer die 1114. Interposer die 1114 can include a set of routing features 1120. Set of routing features 1120 (*a*) can route power (e.g., from a substrate below, not pictured) to interposer die 1104, thereby potentially ensuring reliable power delivery to interposer die 1104, including, e.g., sensitive analog circuits on the side of interposer die 1104 proximate to connected module 1106 that enable PHYs that communicate signals originating from chiplet die 1102 to communication module 1106. Set of routing features 1120 (*b*) can route power to connected module 1106. Apparatus 1100 may be expensive to manufacture at least in part due to the size of interposer die 1104.

Figure 12:
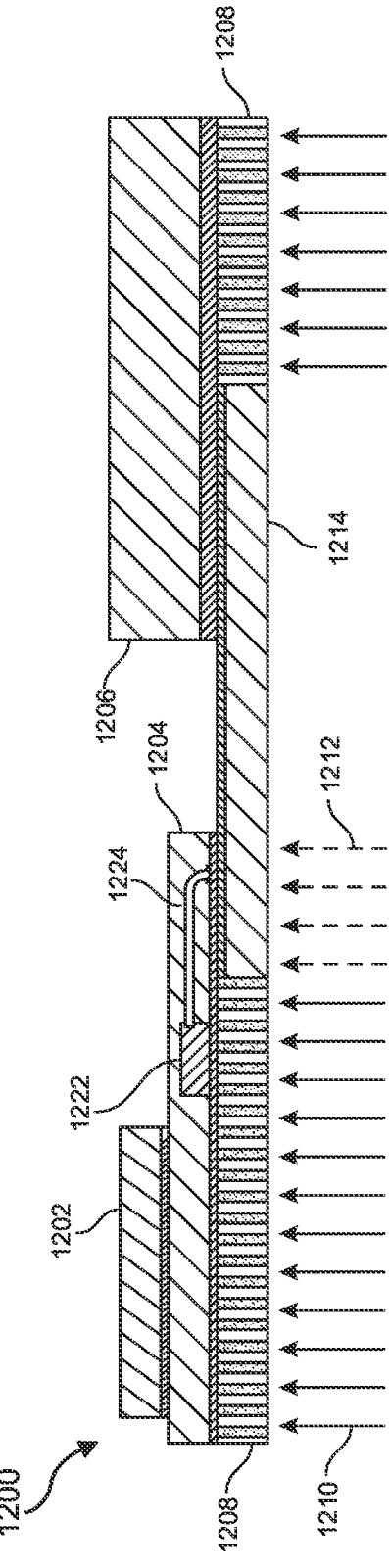
FIG. 12 is an illustration of an example apparatus for bridge-based packaging with direct power delivery.

FIG. 12 is an illustration of an example apparatus 1200. As shown in FIG. 12, apparatus 1200 can include a chiplet die 1202, an interposer die 1204, a connected module 1206, a fanout bridge 1214, and a set of electrical connectivity elements 1208. Electrical connectivity elements 1208 can deliver power directly to portions of interposer die 1204, including, e.g., power delivery area 1210. Because fanout bridge 1214 is directly below a portion of interposer die 1204, there is no direct power delivery to interposer die 1204 across area 1212. However, sensitive circuit 1222 can be placed in a location of interposer die 1204 corresponding to direct power delivery area 1210, such that power delivery to sensitive circuit 1222 is reliable, and the behavior of sensitive circuit 1222 is therefore reliable. In one example, sensitive circuit 1222 can represent a PHY. A routing feature 1224 can route signals from sensitive circuit 1222 to fanout bridge 1214, even though sensitive circuit 1222 is not directly above fanout bridge 1214. Thus, sensitive circuit 1222 can transmit signals (e.g., originating from chiplet 1202) via routing feature 1224, through fanout bridge 1214, and to connected module 1206. The larger size of interposer die 1204 compared to some of the other examples described herein and the use of routing feature 1224 may increase the relative cost and/or complexity of apparatus 1200.

While the foregoing disclosure sets forth various implementations using specific block diagrams, steps, and examples, each block diagram component, step, operation, and/or component described and/or illustrated herein can be implemented, individually and/or collectively, using a wide range configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus for bridge-based packaging with direct power delivery, the apparatus comprising:
   a first layer parallel and adjacent to a second layer, wherein:
   the second layer comprises:
   an interposer die; and
   a connection die;
   the first layer comprises:
   a first-layer bridge die spanning across the interposer die and the connection die, the first-layer bridge die being parallel to and adjacent to the interposer die; and
   the interposer die comprises:
   a set of routing features configured to route signals from the interposer die to the first-layer bridge die.

2. The apparatus of claim 1, wherein the connection die is configured to route signals from the first-layer bridge die to a fanout bridge below the connection die.

3. The apparatus of claim 2, wherein the connection die comprises a set of vias configured to route signals from the first-layer bridge die to the fanout bridge.

4. The apparatus of claim 1, wherein:
   the interposer die comprises an active die; and
   the first layer further comprises a chiplet die which comprises an active die.

5. The apparatus of claim 1, wherein the first-layer bridge die comprises a passive die.

6. The apparatus of claim 1, wherein the connection die comprises a passive die.

7. The apparatus of claim 1, wherein at least one of the first-layer bridge die and the connection die comprises an active die comprising circuitry configured to implement a built-in self-test.

8. The apparatus of claim 1, wherein the set of routing features comprises a set of vias.

9. The apparatus of claim 8, wherein the set of vias comprises, for each logical connection from a set of physical interfaces, a subset of vias connected in parallel.

10. A system for bridge-based packaging with direct power delivery, the system comprising:

a substrate;

a mold coupled to the substrate, the mold comprising:

a fanout bridge; and a set of electrical connectivity elements;

a multi-layer module coupled to the mold, the multi-layer module comprising:

a second layer comprising:

an interposer die; and a connection die above a first side of the fanout bridge; and an first layer parallel and adjacent to the second layer comprising:

a first-layer bridge die spanning across the interposer die and the connection die, the first-layer bridge die being parallel and adjacent to the interposer die;

wherein the interposer die comprises:

a set of routing features configured to route signals from the interposer die to the first-layer bridge die.

11. The system of claim 10, wherein a subset of the set of electrical connectivity elements are below a set of physical interfaces.

12. The system of claim 10, further comprising a connected module stacked on the mold and at least in part over a second side of the fanout bridge.

13. The system of claim 10, wherein the connection die comprises a set of vias configured to route signals from the first-layer bridge die to the fanout bridge.

14. The system of claim 11, wherein:

the interposer die comprises an active die; and the first layer further comprises a chiplet die which comprises an active die.

15. The system of claim 11, wherein the first-layer bridge die comprises a passive die.

16. The system of claim 11, wherein the connection die comprises a passive die.

17. The system of claim 11, wherein at least one of the first-layer bridge die and the connection die comprises an active die comprising circuitry configured to implement a built-in self-test.

18. The system of claim 11, wherein the set of routing features comprises a set of vias.

19. The system of claim 11, wherein the multi-layer module comprises a chip-on-wafer module.

20. The apparatus of claim 1, wherein the set of routing features comprises a set of through silicon vias running through at least one layer of the interposer die and to the first-layer bridge die.

\* \* \* \* \*